United States Patent [19]

Aina

[11] Patent Number: 4,960,718
[45] Date of Patent: Oct. 2, 1990

[54] MESFET DEVICE HAVING A SEMICONDUCTOR SURFACE BARRIER LAYER

[75] Inventor: Olaleye A. Aina, Columbia, Md.

[73] Assignee: Allied-Signal Inc., Morris Township, Morris County, N.J.

[21] Appl. No.: 218,506

[22] Filed: Jul. 5, 1988

Related U.S. Application Data

[62] Division of Ser. No. 808,920, Dec. 13, 1985, abandoned.

[51] Int. Cl.$^5$ ............... H01L 21/265; H01L 21/338
[52] U.S. Cl. ......................................... 437/22; 437/912
[58] Field of Search .................................. 437/22, 912

[56] References Cited

U.S. PATENT DOCUMENTS

| | | |
|---|---|---|
| 3,183,129 | 5/1965 | Tripp . |
| 3,914,784 | 10/1975 | Hunsperger et al. . |
| 3,935,586 | 1/1976 | Landheer et al. . |
| 4,011,113 | 3/1977 | Thompson et al. . |
| 4,075,651 | 2/1978 | James . |
| 4,194,021 | 3/1980 | Messick ........................... 357/22 I |
| 4,236,166 | 11/1980 | Cho et al. . |
| 4,237,473 | 12/1980 | Chiang . |
| 4,263,605 | 4/1981 | Christou et al. . |
| 4,356,056 | 10/1982 | Cornette et al. . |
| 4,379,005 | 4/1983 | Hovel et al. ..................... 357/22 A |
| 4,424,525 | 1/1984 | Mimura ............................ 357/22 |
| 4,471,367 | 9/1984 | Chen et al. ...................... 357/22 |

FOREIGN PATENT DOCUMENTS

| | | | |
|---|---|---|---|
| 0133836 | 10/1981 | Japan .................................... | 437/22 |
| 59-10057 | 6/1984 | Japan . | |

OTHER PUBLICATIONS

Ohno et al.—IEEE Electron Device Letters, vol. ED-L-1, No. 8, Aug. 1980, pp. 154-155, "Double Heterostructure GaInAs MESFETS by MBE".
Bardy et al.—Applied Physics Letters, vol. 38, No. 10, May 1981, pp. 817-819.
Ohno et al.—Institute of Physics Conference Series, No. 56, Chapter 7, 1981, pp. 465-473.
Aina et al.—Journal of Applied Physics, vol. 56, No. 6, Sep. 15, 1984, pp. 1717-1721.
Sleger et al.—IEEE Transactions on Electron Devices—vol. ED-28, No. 9, Sep. 1981, pp. 1031-1034.
J. S. Barrea et al., "InP Schottky-Gate Field-Effect Transistors", Manuscript received Mar. 6, 1975, pp. 1023-1030.
L. Messick, "Power Gain and Noise of InP and GaAs Insulated Gate Microwave FETs", 1979, vol. 22, pp. 71-76.
K. R. Gleason et al., "Ion-Implanted N-Channel InP Metal Semiconductor Field-Effect Transistor", published Feb. 28, 1978, pp. 578-581.

Primary Examiner—Olik Chaudhuri
Assistant Examiner—Ourmazd Ojan
Attorney, Agent, or Firm—Howard G. Massung; Robert A. Walsh

[57] ABSTRACT

An InP MESFET having a semiconductor surface barrier layer formed of GaInP or AlInP. The semiconductor surface barrier layer is formed between an active layer and a gate electrode and the barrier height of the gate for the semiconductor surface barrier layer is higher than the barrier height of the gate for InP. In a method of forming an InP MESFET according to the present invention, the semiconductor surface barrier layer is formed by high dose implantation of Ga or Al into the active region. Surface barrier layers formed of other compounds, for example GaInAsP or AlInAsP, which have a lattice match with InP can be formed by other methods such as epitaxial growth.

10 Claims, 1 Drawing Sheet

MESFET DEVICE HAVING A SEMICONDUCTOR SURFACE BARRIER LAYER

BACKGROUND OF THE INVENTION

1. Field of the Invention

The present invention relates to an indium phosphide (InP) metal semiconductor field-effect transistor (MESFET), and more particularly, an InP MESFET including a semiconductor surface barrier layer, in which the barrier height across the interface of a gate electrode and the semiconductor surface barrier layer is higher than the barrier height across an interface of the gate electrode and InP without the semiconductor surface barrier layer.

2. Description of the Related Art

Field effect transistors formed on InP are suitable for applications in microwave systems, millimeter wave systems, high speed digital systems, and optoelectronics. These applications of field effect transistors, and these systems, could, for example, involve integrating an InP low noise or low power amplifier with photodetectors or microwave or millimeter wave sources. Field-effect transistors formed on InP devices are desirable because InP can be lattice matched to materials such as InGaAs and InGaAsP which are used as photodetectors, and because InP has a high breakdown voltage when compared to silicon (Si) or gallium arsenide (GaAs). Furthermore, InP has a high radiation tolerance and the electron velocity in InP is higher than the electron velocity in GaAs — two factors which make InP desirable for microwave and millimeter wave applications. Moreover, optical fiber communication has an optimum frequency in the region of the bandgap of InGaAsP.

MESFETs formed on InP, however, have produced poor results because of the low barrier height across the interface of the gate electrode and n-type InP. In particular, GaAs MESFETs having barrier heights of 0.8–0.9 eV have lower noise figures and higher gains than equivalent InP MESFETs with barrier heights of 0.45–0.55 eV, as set forth in "InP Schottky-Gate Field-Effect Transistors," by J. S. Barrera and R. J. Archer, IEEE Transactions on Electron Devices, Vol. Ed-22, No. 11, p. 1023 (1975) and "Ion-Implanted n-Channel InP Metal Semiconductor Field-Effect Transistor," by Gleason et al., Applied Physics Letters, Vol. 32, p. 578 (1978).

The low barrier height across the interface between a metal (gate electrode) and InP has resulted in the use of InP field-effect transistors having a metal-insulator-semiconductor sandwich structure (MISFET). The insulator placed between the metal gate electrode and the InP semiconductor may be $Si_3N_4$, $SiO_2$, $Al_2O_3$, or oxides of InP. MISFETs, however, have several disadvantages: (1) the DC characteristics of MISFETs tend to drift because of the low quality of the insulators, which can lead to changes in the operating point of an amplifier in high frequency applications, resulting in changes in the gain; (2) irregularities at the insulator-semiconductor interface reduce the electron velocities due to scattering, thereby preventing the device from operating at the highest predicted frequencies; and (3) MISFETs are inherently less radiation hardened than MESFETs, and therefore are less suitable for military and space applications

SUMMARY OF THE INVENTION

An object of the present invention is to provide an InP MESFET having a semiconductor surface barrier layer, in which the barrier height across the interface of a gate electrode and the semiconductor surface barrier layer is higher than the barrier height across the interface of a gate electrode and InP without the semiconductor surface barrier layer.

Another object of the present invention is to provide a method of fabricating an InP MESFET having a semiconductor surface barrier layer.

The present invention is directed to an InP MESFET having a semiconductor surface barrier layer which provides a higher barrier height across the interface with the gate electrode than the barrier height across the interface of the gate electrode with InP. The present invention is also directed to a method of fabricating a MESFET having a GaInP or AlInP surface barrier layer by high dose ion implantation of Ga or Al.

An InP MESFET according to the present invention includes an InP substrate, an active region, or layer, formed on the substrate, source and drain regions formed in the active region, and a GaInP or AlInP semiconductor surface barrier layer formed in, or over, the active region.

A gate electrode is formed on the semiconductor surface barrier layer and source and drain electrodes are formed on the source and drain region, the barrier height across the gate electrode-semiconductor surface barrier layer interface being higher than the barrier height across the gate electrode-active region or gate electrode-InP interface. It is to be understood that the active region may be formed in the substrate by ion implantation or on the main surface of the substrate by epitaxial growth! and that the semiconductor surface barrier layer may be formed in or on the active regon.

The InP MESFET of the present invention has significant advantages over conventional MESFETs in that it is capable of operating at higher frequencies than a GaAs MESFET in view of the higher electron velocities in InP than in GaAs, it is not subject to DC drift, and it is more radiation hardened.

Moreover, based on the fact that GaP and AlP have barrier heights in the range of 1.5 eV, it is predicted that an InP MESFET including a semiconductor surface barrier layer of GaInP or AlInP will have a barrier height of approximately 0.8–0.9 eV. Thus, an InP MESFET including a surface barrier layer of GaInP or AlInP should have a lower leakage current and therefore less noise, and more gate control because of the ability to apply higher gate voltages than comparable InP MESFETs.

The many advantages of the present invention will be apparent from the following description in conjunction with the accompanying drawings in which like reference numerals refer to like elements.

DESCRIPTION OF THE PREFERRED EMBODIMENTS

A method of fabricating an InP metal-semiconductor field-effect semiconductor device including a semiconductor surface barrier layer will be described with reference to FIGS. 1, 2A, 2B, 3A and 3B.

Figure 1:
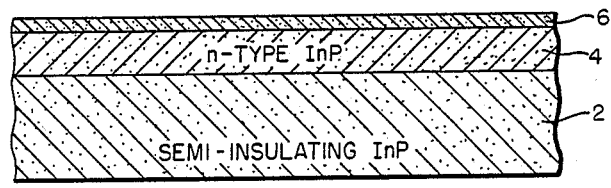
FIGS. 1, 2A and 2B are cross-sectional views showing various stages in the fabrication of a MESFET according to the present invention.

FIG. 1 illustrates a semi-insulating InP substrate 2 in which an n-type InP active region 4 is formed by implanting silicon (Si). The Si is implanted at an energy of approximately 125 keV with a dose of approximately $5 \times 10^{12}$ cm$^{-2}$, to a depth of approximately 2600Å. Then, a semiconductor surface barrier layer 6 is formed in the active region 4. In the preferred embodiment, Ga or Al ions are implanted to form a GaInP or AlInP semiconductor surface barrier layer 6. The Ga or Al atoms are implanted at an energy of approximately 60 keV with a dose of $2 \times 10^{16}$ cm$^{-2}$ or at 25 keV with a dose of $2 \times$ cm$^{-2}$, and the semiconductor surface barrier layer 6 has a thickness of approximately 600Å.

Figure 2A:
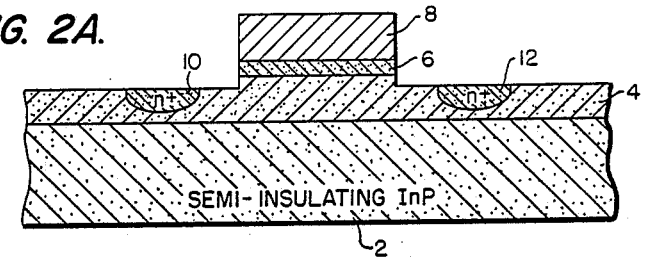
Figure 2B:
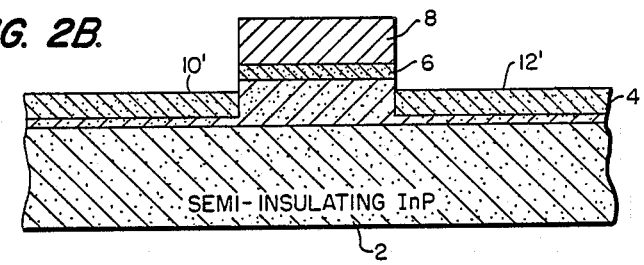

With reference to FIGS. 2A and 2B, a gate electrode 8 is deposited through a mask formed by the well known "lift-off" technique. If the gate material is tungsten, the gate is deposited by electron beam deposition, while if the gate material is tungsten silicide, the silicide gate is deposited by sputtering. The gate 8 is then used as a mask to protect a portion of the semiconductor surface barrier layer 6, positioned thereunder during an etching process performed to remove selected portions of the semiconductor surface barrier layer 6, which are not protected by the gate 8. The etchant may comprise sulfuric acid, deionized water, and hydrogen peroxide in a ratio of approximately 100:5:1, resulting in an etching rate of approximately 100Å/min. The etching time is elected so that the semiconductor surface barrier layer 6 and a small amount (approximately 100–200 Å) of the active region 4 are removed. Then, Si is implanted at an energy of approximately 50 keV with a dose of approximately $10^{14}$ cm$^{-2}$ to form n$^+$-type highly doped source and drain regions 10 and 12 having a depth of approximately 1000Å. The highly doped source and drain regions 10 and 12 shown in FIG. 2A can be implanted through openings in a mask formed by a lift-off technique. Alternatively, source and drain regions 10' and 12', shown in FIG. 2B, can be formed using a self-aligned technique with the gate 8 functioning as a mask.

After the source and drain regions 10 and 12, or 10' and 12', are implanted, the device is annealed at a temperature suitable for the formation of compounds of GaInP or AlInP; the range of temperatures extending from 700° C. to 850° C. Capless annealing at a temperature of 850° C. with an annealing time of 15 minutes and an AsH$_3$ or InAs overpressure is the preferred annealing technique.

Figure 3A:
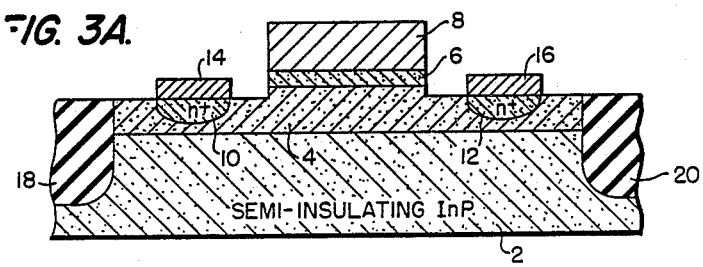
FIG. 3A is a cross-sectional view of a first embodiment of a MESFET according to the present invention.
Figure 3B:
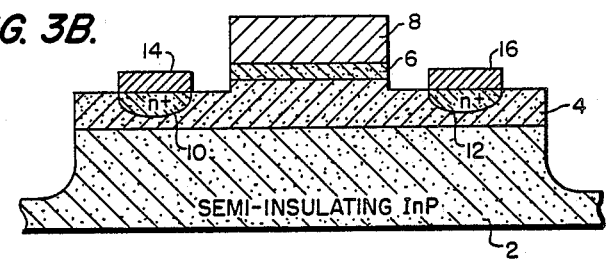
FIG. 3B is a cross-sectional view of a second embodiment of a MESFET according to the present invention.

After the annealing process is completed source and drain electrodes 14 and 16, shown in FIGS. 3A and 3B, are deposited through a mask formed using a lift-off technique. Ohmic contact is established between the source and drain electrodes 14 and 16 and the source and drain regions 10 and 12, respectively, by low temperature annealing at a temperature between 370° and 450° C., for example. The source and drain electrodes 14 and 16 may be formed of, for example, an AuGe alloy.

The device is completed by implanting iron (Fe) or oxygen (O$_2$) ions to form the isolation regions 18 and 20, shown in FIG. 3A. Alternatively, the device may be electrically isolated by mesa etching using a mask formed by a lift-off technique to produce a device as shown in FIG. 3B.

As previously stated, the preferred materials for the surface barrier layer 6 are GaInP and AlInP, which can be formed by high dose implantation of Ga or Al. Alternatively, the surface barrier layer 6 may be a new layer, rather than an implanted layer, formed of GaInAsP or AlInAsP, or any other compound or alloy comprising at least three elements selected from groups III and V of the Periodic Table and having a lattice match with InP, and for which the barrier height of the gate 8 is higher than the barrier height of the gate 8 for InP. The barrier height across the interface of the gate 8 and the semiconductor surface barrier layer 6 should be greater than 0.55 eV and preferably above 0.8 ev. The preferred materials for the gate 8 are tungsten and tungsten silicide; however, other gate materials such as aluminum, titanium, platinum, gold, multi-layer combinations of metals, and compounds such as AuGe and AuGeNi, are contemplated. The primary considerations in selecting a gate material are the structural strength and the conductivity of the material.

The teachings of the present invention are set forth with reference to devices formed by the ion implantation of various layers. It is understood, however, that the teachings are equally applicable to any other known method of fabricating semiconductor devices, for example, the epitaxial growth of the various layers. In particular, in the method described above, the surface barrier layer 6 is formed by ion implantation and annealing; however, it is possible to form the surface barrier layer 6 by the epitaxial growth of a semiconductor layer having a lattice match with InP and a barrier height to metal which is higher than the barrier height of InP to metal.

The many features and advantages of the MESFET of the present invention will be apparent to those skilled in the art from the detailed specification. Further, since numerous modifications and changes will readily occur to those skilled in the art, the appended claims are intended to cover all suitable modifications and equivalents falling within the true spirit and scope of the invention.

What is claimed is:

1. A method of fabricating a semiconductor device on a semi-insulating InP substrate, comprising the steps of:
    (a) forming an active layer in the InP substrate;
    (b) forming a semiconductor surface barrier layer in the active layer by implanting an element selected from the group of Ga and Al;
    (c) forming a gate electrode on a portion of the semiconductor surface barrier layer, the barrier height across the interface of the gate electrode and the semiconductor surface barrier layer being higher than the barrier height across an interface of the gate electrode and the active region;
    (d) removing selected portions of the semiconductor surface barrier layer;
    (e) forming source and drain regions on selected portions of the surface of the active layer where the semiconductor surface barrier layer has been removed; and
    (f) annealing the semiconductor device at a temperature of at least 700° C.

2. A method according to claim 1, further comprising the step of forming source and drain electrodes on the respective source and drain regions.

3. A method according to claim 1, wherein:
step (a) comprises implanting Si at approximately 125 keV with a dose of approximately $5 \times 10^{12}$ cm$^{-2}$; and
step (e) comprises implanting Si at approximately 50 keV with a dose of approximately $10^-$cm$^{-1}$.

4. A method according to claim 1, further comprising the step of forming isolation regions to electrically isolate the semiconductor device.

5. A method according to claim 4, wherein said isolation region forming step comprises implanting ions of an element selected from the group of Fe and $O_2$.

6. A method according to claim 1, wherein step (d) comprises etching the selected portions of the semiconductor surface barrier layer using the gate electrode as a mask.

7. A method according to claim 1, wherein step (f) comprises annealing at approximately 850° C. for approximately 15 minutes.

8. A method according to claim 1, wherein:
step (b) comprises implanting at approximately 25 keV with a dose of $2 \times 10^{16}$ to $2 \times 10^{17}$ cm$^{-2}$.

9. A method according to claim 1, wherein:
step (b) comprises implanting at approximately 60 keV with a dose of $2 \times 10^{16}$ cm$^{-2}$.

10. A method according to claim 1, wherein:
step (b) forms a surface barrier layer having a thickness of approximately 600A.

* * * * *